United States Patent
Reid

(10) Patent No.: US 10,514,419 B2
(45) Date of Patent: Dec. 24, 2019

(54) METHOD OF IDENTIFYING A MECHANICAL TRIP IN AN ELECTRONIC MINIATURE CIRCUIT BREAKER

(71) Applicant: Schneider Electric USA, Inc., Andover, MA (US)

(72) Inventor: Paul A Reid, Cedar Rapids, IA (US)

(73) Assignee: Schneider Electric USA, Inc., Andover, MA (US)

( * ) Notice: Subject to any disclaimer, the term of this patent is extended or adjusted under 35 U.S.C. 154(b) by 0 days.

(21) Appl. No.: 15/670,088

(22) Filed: Aug. 7, 2017

(65) Prior Publication Data

US 2019/0041461 A1 Feb. 7, 2019

(51) Int. Cl.
  *G01R 31/327* (2006.01)
  *H01H 47/00* (2006.01)
  *H02H 3/04* (2006.01)

(52) U.S. Cl.
  CPC ....... *G01R 31/3277* (2013.01); *H01H 47/002* (2013.01); *H02H 3/044* (2013.01)

(58) Field of Classification Search
  CPC .................................................. G01R 31/3277
  USPC ............................. 324/424; 702/187; 335/14
  See application file for complete search history.

(56) References Cited

U.S. PATENT DOCUMENTS

| 8,737,033 B2 * | 5/2014 | Parker | H01H 71/04 |
| | | | 361/115 |
| 2010/0259347 A1 * | 10/2010 | Ziegler | H01H 83/04 |
| | | | 335/14 |

* cited by examiner

*Primary Examiner* — Farhana A Hoque
(74) *Attorney, Agent, or Firm* — Locke Lord LLP

(57) ABSTRACT

A method of establishing, and recording, the cause of a power interruption to the load in solenoid-operated electronic miniature circuit breakers of various types without extensive digital resources is presented. In some designs of electronic miniature circuit breakers a circuit breaker trip event will change the inductance of the trip solenoid. This change will take place for an electronic trip or a mechanical trip. A record of the electronic trip signal issued to the solenoid will be present to check against and differentiate the occurrence of an electronic trip from a mechanical trip. The mechanical trip occurs without the electronics and is also indicated by the change in inductance. Thereby, the cause of the power interruption can be determined, recorded and reported.

8 Claims, 4 Drawing Sheets

METHOD OF IDENTIFYING A MECHANICAL TRIP IN AN ELECTRONIC MINIATURE CIRCUIT BREAKER

BACKGROUND OF THE INVENTION

1. Field of the Invention

The present invention pertains to electronic miniature circuit breakers such as the arc fault circuit interrupter (AFCI), combination arc fault circuit interrupter (CAFCI), dual function (DF) arc fault interrupter/ground fault interrupter (AFCI/GFCI), and ground fault circuit interrupter (GFCI) types and particularly those which can determine, record and report the cause of an interruption of power to the load.

2. Discussion of Related Art

With an electronic miniature circuit breaker such as the dual function (AFCI/GFCI) type there are three basic modes for which power to the branch circuit is interrupted, with each mode having two subcategories: 1) electronic trip, due to the AFCI or GFCI function; 2) mechanical trip, due to high instantaneous overcurrent (magnetic) or a lower and slower overcurrent (thermal/bimetal); and 3) an "upstream close-down" event, where a) someone turns the circuit breaker off at the handle, i.e. a "handle turn off," or b) a power interruption occurring upstream from the circuit breaker.

There is a recognized need in the art to establish and report the cause of power interruption to the load so that the operator can properly address the maintenance of the electric system. In an electronic circuit breaker as cited above, it will be appreciated that either or both the supply and return current paths are monitored, typically by Current Transformers (CTs), shunt resistors, or other sensing means to establish arc fault (AF) or ground fault (GF) current flow anomalies.

When AF or GF current anomalies occur, the electronics (microprocessor, analog detection circuit, etc.) of the circuit breaker will issue a trip signal to an actuator, e.g. a solenoid, to operate a movable contact and separate the contacts of the circuit breaker. This electronic trip signal, and the reason for it, can be recorded and later displayed to the operator. For example U.S. Pat. No. 8,737,033, to Parker et al., proposes to record the behavior of current through the breaker, check the electronic record, and if no AF/GF command is issued, check the history of the current profile to determine if one of the mechanical trip subcategories is indicated, and if not, assume an upstream close-down event happened; and then record and report the findings. This plan requires the digital resources for the recording and processing of the current profile to effectuate this scheme.

SUMMARY OF THE INVENTION

The present invention provides a method of establishing, and reporting, the cause of a power interruption to the load in electronic miniature circuit breakers without the need for extensive digital resources. In some designs of electronic miniature circuit breaker, like that of the Schneider Electric's SQUARE D brand QO dual function circuit breaker, a trip event will change the inductance of the trip solenoid. This change will take place for both an electronic trip or a mechanical trip. However, there will be a record of the electronic trip signal issued to the solenoid to check against and differentiate the occurrence of an electronic trip from a mechanical trip which occurs without the electronics and is also indicated by the change in inductance.

The change of inductance is due to a position shift in parts of the trip latch mechanism. When the latching arm of the mechanism is delatched from its hole in the latch plate to trip the circuit breaker, i.e. a trip event separates the separable contacts, the latching arm moves to a position where it presses against a trip link attached to the plunger of the solenoid thus causing the solenoid plunger to move further into the solenoid core and change the inductance of the solenoid actuator in its resting position.

In the event of a power interruption in the branch circuit, and in the absence of the electronic trip signal, this change in inductance can be measured, i.e. detected, and used to determine if a mechanical trip occurred. If a mechanical trip did not occur, and an electronic trip signal was not issued, it can be assumed an upstream close-down occurred at the handle or upstream in the system, and the reason for the close-down can be verified at the circuit breaker handle, through a local indicator, or elsewhere by reading a record of the event reported remotely. The handle of the circuit breaker operates directly on the separable contacts during a manual turn off and does not affect the latch of the trip mechanism, so no change in inductance of the solenoid will occur. If the handle is still in the ON position it can be assumed that the power interruption occurred upstream from the circuit breaker.

In essence, the only thing which must be added to an electronic miniature circuit breaker in accordance with the present invention is an inductance checking circuit for the solenoid. In this scenario, reserve power to run the inductance check after a power failure is assumed to already be available as a part of the power supply arrangement of the circuit breaker electronics. This must power the electronics, e.g. a microcontroller or microprocessor and any memory storage operations, to record and/or report the event, as would be known in the art.

In one aspect of the present invention a method of operating an electronic miniature circuit breaker with a trip mechanism operated by a solenoid is presented, including the steps of:

a) detecting a power interruption event at the breaker; then checking electronics trip data memory and
  if a trip signal was activated, record and/or report the event as an electronic trip (e.g. Arc fault or ground fault);

b) and if a trip signal was not activated,
measuring a solenoid Inductance (L) and determining if L is in a predetermined range or out of the predetermined range, and:
i) if L is in range then record and/or report the event as an upstream close-down; and
ii) if L is out of range then record and/or report the event as a mechanical trip (e.g. Short circuit or thermal overload).

It will be appreciated by those of skill in the art that the hardware for accomplishing such method steps is readily available, and need not be further discussed in detail to achieve a thorough understanding or practice of the present invention.

BRIEF DESCRIPTION OF THE DRAWINGS

The foregoing and other advantages of the disclosed embodiments will become apparent upon reading the following detailed description and upon reference to the drawings, wherein.

DETAILED DESCRIPTION OF THE PREFERRED EMBODIMENT

As an initial matter, it will be appreciated that the development of an actual commercial application incorporating aspects of the disclosed embodiments will require many implementation specific decisions to achieve the developer's ultimate goal for the commercial embodiment. Such implementation specific decisions may include, and likely are not limited to, compliance with system related, business related, government related and other constraints, which may vary by specific implementation, location and from time to time. While a developer's efforts might be complex and time consuming in an absolute sense, such efforts would nevertheless be a routine undertaking for those of skill in this art having the benefit of this disclosure.

It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the invention.

Further, words of degree, such as "about," "substantially," and the like may be used herein in the sense of "at, or nearly at, when given the manufacturing, design, and material tolerances inherent in the stated circumstances" and are used to prevent the unscrupulous infringer from unfairly taking advantage of the invention disclosure where exact or absolute figures and operational or structural relationships are stated as an aid to understanding the invention.

Figure 1:
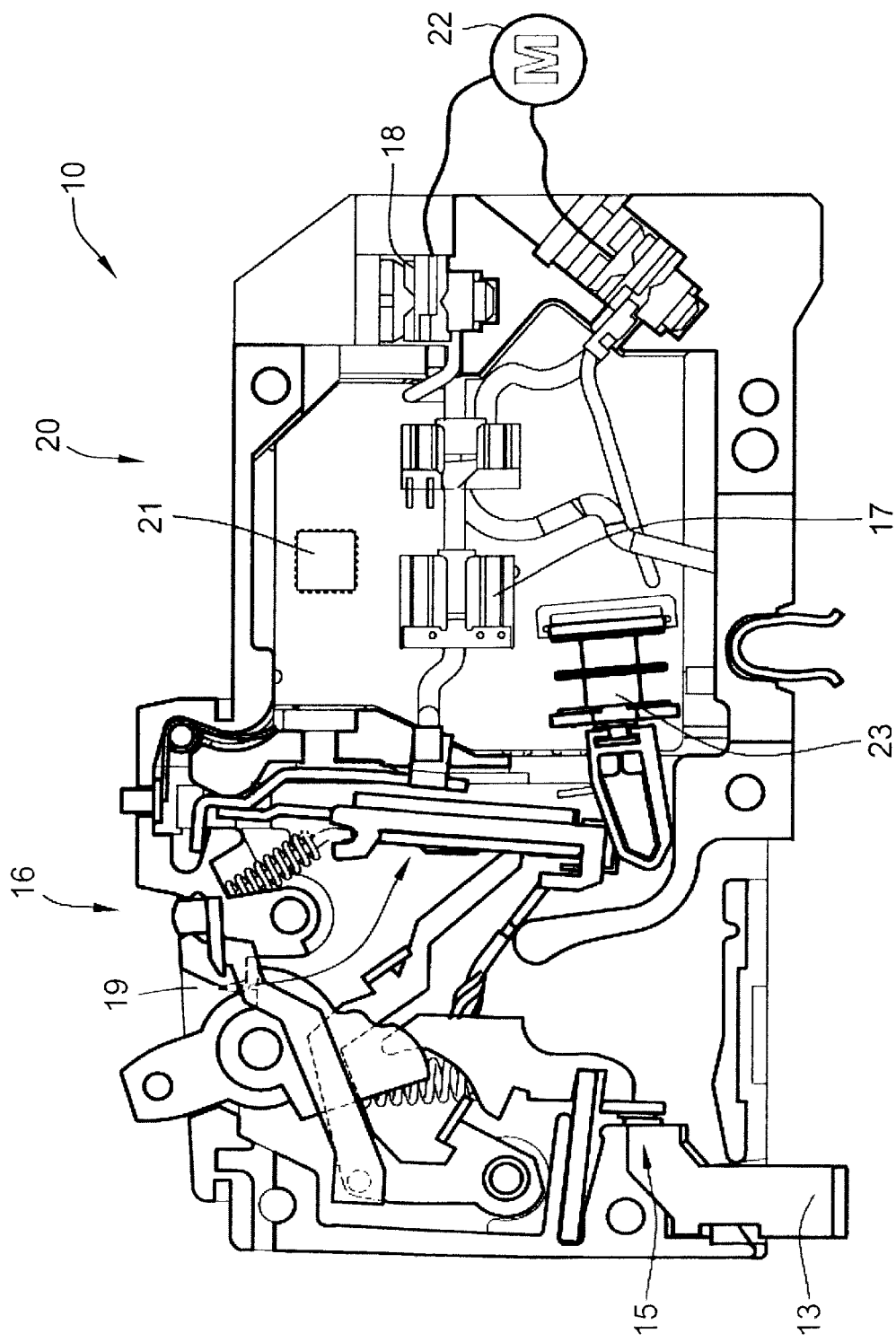
FIG. 1 is an illustration of the working parts of an exemplary dual function (AFCI/GFCI) type circuit breaker as known in the art.

FIG. 1 illustrates the basics of a known circuit breaker 10 of the Dual Function Arc Fault/Ground Fault Circuit Interrupter type. The line current path starts at the line power terminal 13 of the breaker 10 and continues through the separable contacts 15 and a toroidal current transformer current sensor 17 to the load terminal 18 which is wired out to the branch load 22, here represented as a motor. A mechanical "side" or portion 16 of the circuit breaker 10 contains thermal and magnetic trip units 19, typically a bimetal and a magnetic yoke assembly, respectively, which are components for tripping, i.e. separating, the contacts 15, in the event of overcurrent conditions.

An electronic "side" or portion 20 of the circuit breaker 10 contains the current transformer (current sensor) 17, and associated electronics 21 for evaluation of Ground Fault or Arc Fault events. The electronics 21 control an actuator 23, typically a solenoid, whose function is also to trip the separable contacts 15 and remove power from the load 22.

With an electronic miniature circuit breaker 10 such as the dual function (AFCI/GFCI) type as seen in FIG. 1, there are three basic modes that can interrupt power to the branch circuit loads, with each mode having two subcategories: 1) electronic trip due to AFCI or GFCI; 2) mechanical trip, due to high instantaneous overcurrent (magnetic) or a lower and slower overcurrent (thermal/bimetal); and 3) an "upstream close-down" where a) someone turns the breaker off at the handle, i.e. a "handle turn off," or b) the interruption of power occurs upstream of the circuit breaker.

Figure 2:
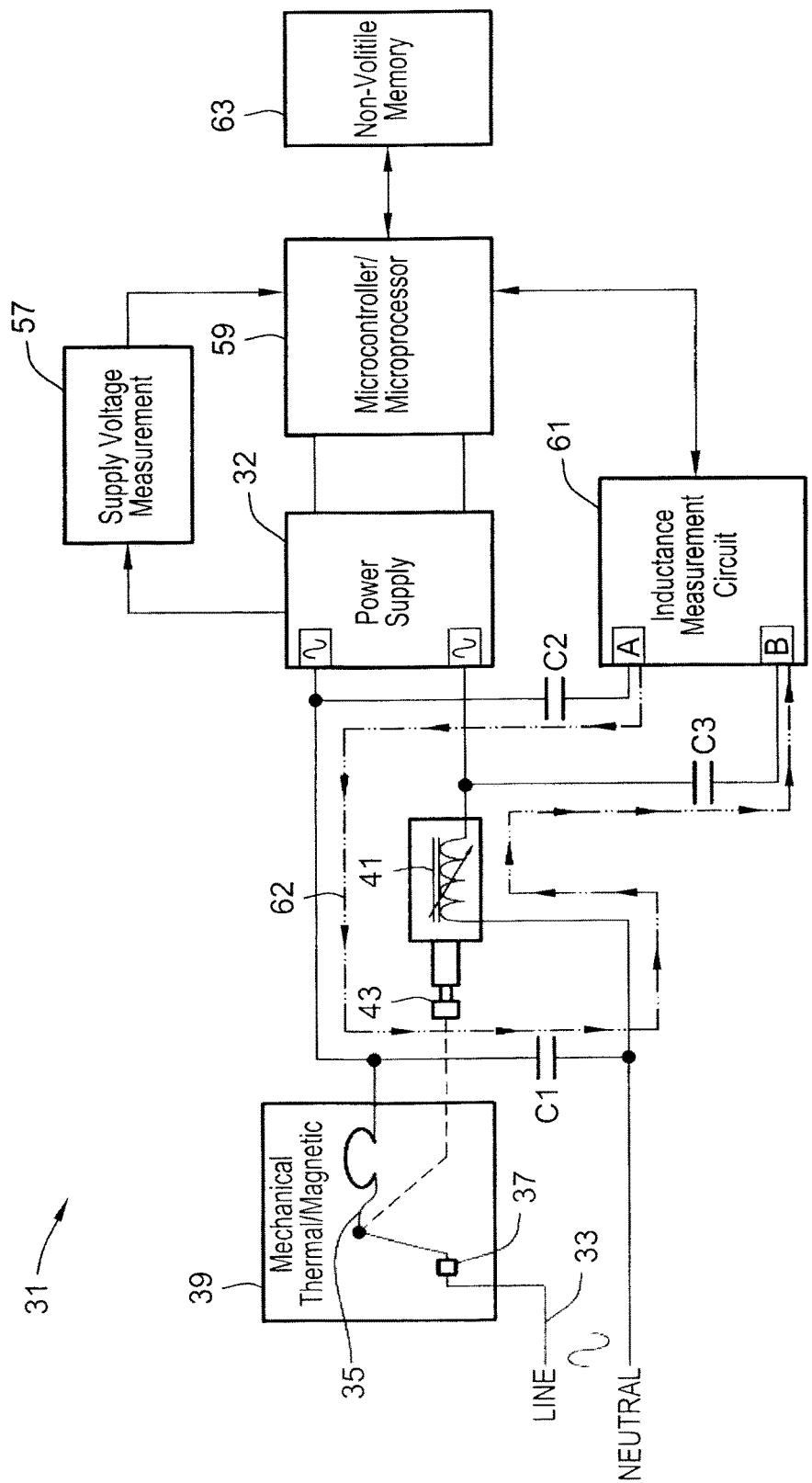
FIG. 2 is the block diagram of operation of the circuit breaker according to the present invention.

Referencing FIG. 2, a block diagram is shown for a microprocessor-controlled inductance measurement circuit to check the solenoid inductance (L) immediately following loss of voltage at the input of the power supply 32. The value of inductance measured is used to determine if a mechanical trip had just occurred.

As seen in FIG. 2, the incoming current path 33 of the breaker 31 contains a latch 35 which operates the separable contacts 37 by either of the thermal/magnetic trip mechanism 39 or the solenoid 41. As further discussed below, a trip, i.e. a mechanical delatching of the trip event to separate the separable contacts 37, will shift the solenoid plunger 43 into the body of the solenoid 41 by about 1 mm producing a measurable change in inductance of the solenoid.

Figure 3:
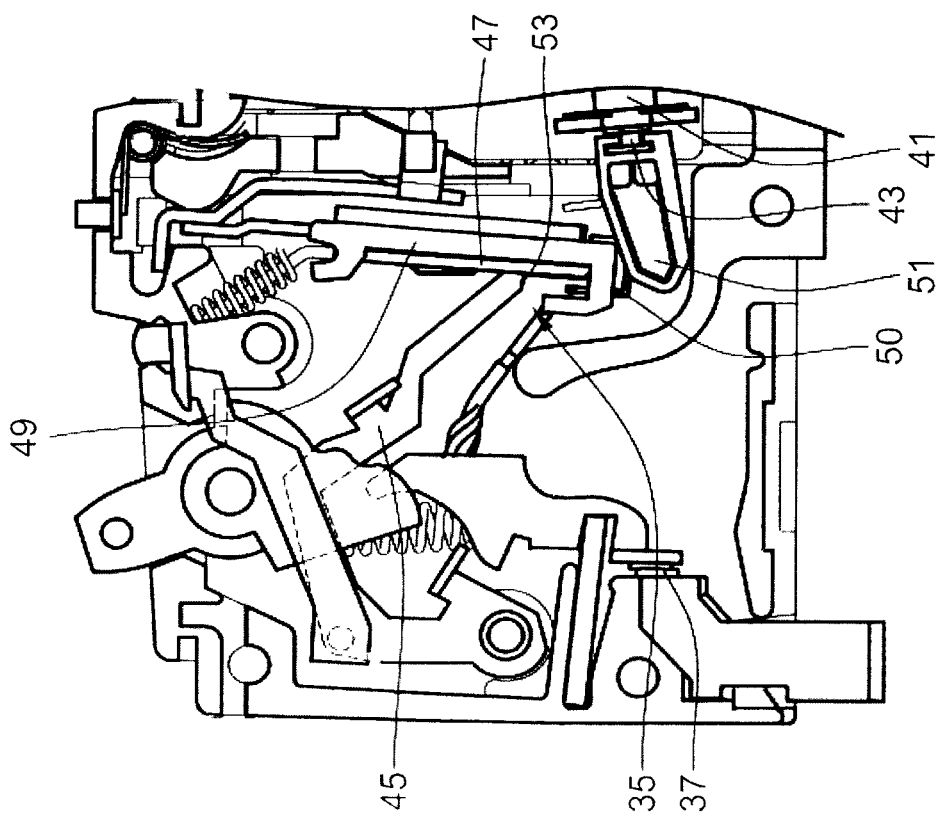
FIG. 3 is a detail illustration of latch mechanism parts of an open case DF circuit breaker in the latched condition.
Figure 4A:
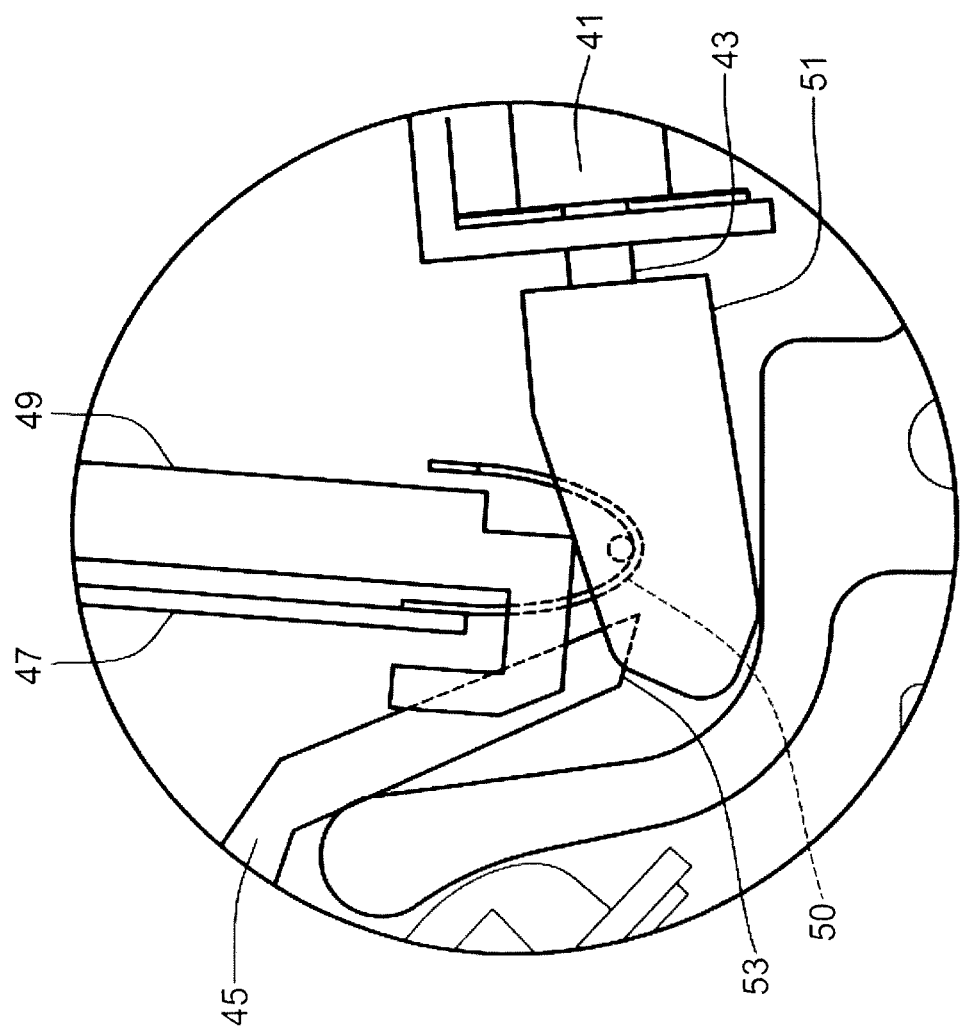
FIG. 4A is a detail view of FIG. 4 showing the end of the trip lever intersecting the trip link of the solenoid.

As seen in FIG. 3 the latching mechanism 35 for a trip comprises the spring-biased trip lever 45 anchored in the latch plate 47 of magnetic yoke 49 when the separable contacts collectively 37 are together. Separating the latch plate 47 from the trip lever 45 causes the trip event, i.e. separation of the separable contacts, as well known in the art. As well understood in the art, for an electronic trip, the solenoid 41 is operated by the AFCI/GFCI electronics, and a trip link 51 on the plunger 43 of the solenoid 41 pulls on the bottom loop 50 of the yoke 49 or latch plate 47 to create the trip. For a thermal trip, within the yoke is a bimetal 41 whose distortion under heat forces the latch plate away from the trip lever 45. For a magnetic trip an over-current inrush within the wiring going through the yoke 49 creates a magnetic field which forces the latch plate away from the trip lever 45.

Figure 4:
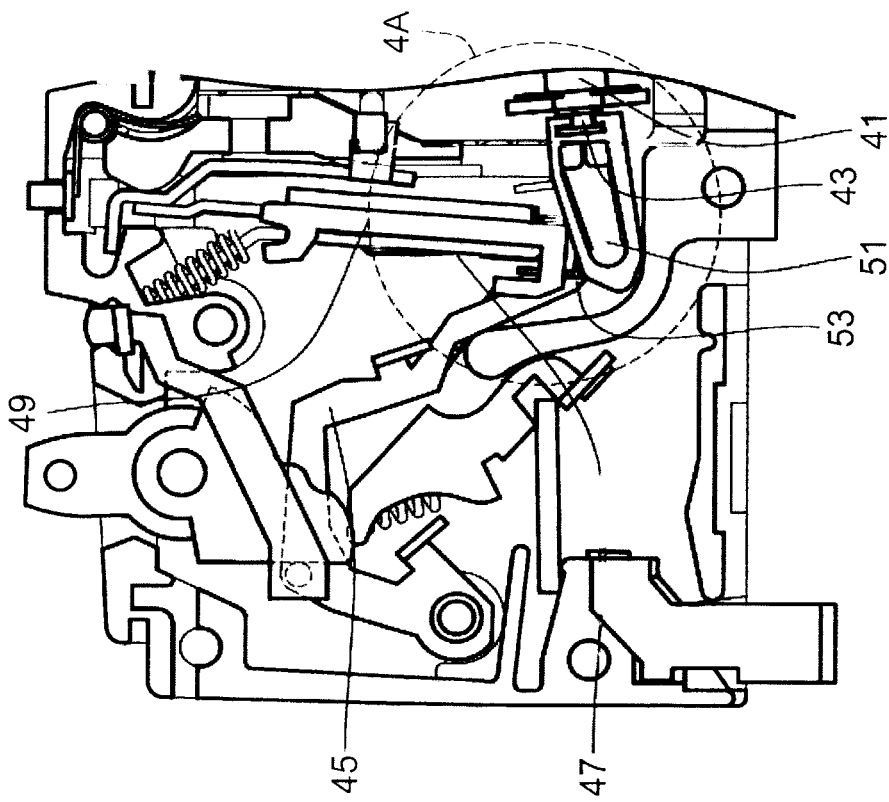
FIG. 4 is an illustration of latch mechanism parts of a DF circuit breaker in the unlatched condition.

As seen in FIG. 4, once the trip lever 45 separates from the latch plate 47, the free end 53 of trip lever 45 is pulled by the spring bias into the trip link 51 causing the solenoid plunger 43 to retract into the body of the solenoid 41, i.e. the wound core, thereby creating a measurable change in the inductance (L) of the solenoid 41.

Turning again to FIG. 2, upon tripping, the Supply Voltage measurement circuit 57 will detect the cessation of incoming power and alert the Microprocessor/Microcontroller (i.e. the required digital processing units of the electronics, hereinafter for simplicity just "microprocessor") 59. The microprocessor 59 will issue a command to the Inductance Measurement Circuit 61 which will send a "stimulus" (e.g. a pulse) 62 from its terminal A through capacitors C2, C1, the coil of the solenoid 41, and capacitor C3, before returning to terminal B of the Inductance Measurement Circuit 61.

This signal path from terminal A to terminal B creates an LC circuit causing a ringing in the stimulus pulse which frequency can be measured by the Inductance Measurement Circuit. Then the inductance (L) can be calculated using the formula of Equation 1:

$$[\text{frequency} = 1/2\pi\sqrt{LC}] \quad \text{Equation 1:}$$

i.e. (frequency equals 1 over 2 pi times the square root of LC);

with the known frequency and known value of C (C=C1+C2+C3).

Alternatively the inductance measurement circuit could drive a signal through the solenoid coil and measure the current out of the coil to determine its impedance, and from the impedance, calculate the inductance of the solenoid coil.

In either case, the necessary computations can be done at the Inductance Measurement Circuit 61 or the microprocessor 59 to make the L value determination, whether as an absolute value or as an "in range/out of range" determination, and the comparison can then done in the microprocessor 59 to determine the power failure causation (electronic/mechanical/upstream close-down) and the result is reported to and recorded in the Non-Volatile memory 63. The result may of course also be reported to a remote system by any appropriate communications means.

While particular aspects, implementations, and applications of the present disclosure have been illustrated and described, it is to be understood that the present disclosure is not limited to the precise construction and compositions disclosed herein and that various modifications, changes, and variations may be apparent from the foregoing descriptions without departing from the invention as defined in the appended claims.

The invention claimed is:

1. A method of operating an electronic miniature circuit breaker with a trip mechanism operated by a solenoid, comprising:
   a) detecting a power interruption event at the circuit breaker; then checking an electronic trip data memory and if a trip signal was activated, record and/or report the event as an electronic trip, wherein an electronic trip is due to one of an arc fault circuit interrupt (AFCI) or a ground fault circuit interrupt (GFCI) function;
   b) and if a trip signal was not activated,
   measuring an Inductance (L) of the solenoid and determining if L is in a predetermined range or out of the predetermined range, and:
   i) if L is in range, then record and/or report the event as an upstream close-down, wherein the upstream close-down comprises one of the circuit breaker having been manually turned off at a handle of the circuit breaker or an interruption of power upstream of the circuit breaker; and
   ii) if L is out of range, then record and/or report the event as a mechanical trip, wherein the mechanical trip comprises one of a thermal trip resulting from a low overcurrent or a magnetic trip resulting from a high overcurrent.

2. The method of claim 1 further comprising recording the event in a nonvolatile memory.

3. The method of claim 1 further comprising measuring inductance via an LC circuit.

4. An electronic miniature circuit breaker with a trip mechanism operated by a solenoid, comprising:
   a microprocessor; and
   an inductance measurement circuit,
   the microprocessor configured to,
   a) receive notice of a power interruption event at the circuit breaker; and then check an electronic trip data memory and if an electronic trip signal was activated, record and/or report the event as an electronic trip, wherein an electronic trip is due to one of an arc fault circuit interrupt (AFCI) or a ground fault circuit interrupt (GFCI) function;
   b) and if an electronic trip signal was not activated,
   cause the inductance measurement circuit to measure an Inductance (L) of the solenoid, and determine if L is in a predetermined range or out of the predetermined range, and:
   i) if L is in range, then record and/or report the event as an upstream close-down, wherein the upstream close-down comprises one of the circuit breaker having been manually turned off at a handle of the circuit breaker or an interruption of power upstream of the circuit breaker; and
   ii) if L is out of range, then record and/or report the event as a mechanical trip, wherein the mechanical trip comprises one of a thermal trip resulting from a low overcurrent or a magnetic trip resulting from a high overcurrent.

5. The electronic miniature circuit breaker of claim 4 further comprising a nonvolatile memory, and wherein the microprocessor is configured to record the event in the nonvolatile memory.

6. The electronic miniature circuit breaker of claim 4 wherein the inductance measurement circuit comprises an LC circuit.

7. The electronic miniature circuit breaker of claim 4, wherein the trip mechanism further comprises a latch and the upstream close-down does not affect the latch.

8. The electronic miniature circuit breaker of claim 4, wherein the inductance measurement circuit is configured to determine if L is in a predetermined range or out of the predetermined range.

* * * * *